(12) United States Patent
Pramod et al.

(10) Patent No.: US 11,283,391 B2
(45) Date of Patent: Mar. 22, 2022

(54) DETECTION OF CURRENT MEASUREMENT GAIN ERRORS IN SYNCHRONOUS MOTOR DRIVES

(71) Applicant: Steering Solutions IP Holding Corporation, Saginaw, MI (US)

(72) Inventors: Prerit Pramod, Saginaw, MI (US); Varsha Govindu, Saginaw, MI (US); Krishna MPK Namburi, Okemos, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 0 days.

(21) Appl. No.: 16/698,170

(22) Filed: Nov. 27, 2019

(65) Prior Publication Data

US 2021/0159838 A1 May 27, 2021

(51) Int. Cl.
*H02P 29/024* (2016.01)
*H02P 6/28* (2016.01)
*G01R 19/00* (2006.01)

(52) U.S. Cl.
CPC .............. *H02P 29/027* (2013.01); *H02P 6/28* (2016.02); *G01R 19/0092* (2013.01)

(58) Field of Classification Search
CPC ........ H02P 29/0243; H02P 21/00; H02P 6/08; H02P 6/10; H02K 37/14; H02K 21/14; H02K 1/145; B62D 5/04
See application file for complete search history.

(56) References Cited

U.S. PATENT DOCUMENTS

| | | | |
|---|---|---|---|
| 6,211,634 B1* | 4/2001 | Heller | H02P 6/00 318/400.02 |
| 7,791,293 B2* | 9/2010 | Nagase | B62D 5/0487 318/400.01 |
| 8,471,507 B2* | 6/2013 | Akaishi | H02P 29/032 318/400.04 |
| 9,806,656 B1* | 10/2017 | Pramod | H02P 29/0241 |
| 9,873,450 B2 | 1/2018 | Pramod et al. | |
| 9,966,890 B2 | 5/2018 | Pramod et al. | |
| 10,340,827 B2 | 7/2019 | Pramod et al. | |
| 10,520,337 B2* | 12/2019 | Hammerschmidt | G01P 21/02 |
| 2014/0091743 A1* | 4/2014 | Suzuki | H02P 29/027 318/400.22 |

* cited by examiner

*Primary Examiner* — Said Bouziane
(74) *Attorney, Agent, or Firm* — Dickinson Wright PLLC

(57) ABSTRACT

Systems and methods for detecting a current measurement gain error in a current measurement system is disclosed. The method includes reading an output voltage signal, extracting a signature of a current measurement gain error from the output voltage signal, detecting an existence of the current measurement gain error based on the signature, and responsive to detecting the existence of the current measurement gain error, identifying a diagnostic voltage phase in which the current measurement gain error exists.

20 Claims, 4 Drawing Sheets

DETECTION OF CURRENT MEASUREMENT GAIN ERRORS IN SYNCHRONOUS MOTOR DRIVES

TECHNICAL FIELD

This disclosure relates to current measurement systems and in particular to systems and methods for detection of current measurement gain errors in current measurement system.

BACKGROUND

Machines using current measurement systems may be susceptible to current measurement gain errors. Example causes of a current measurement gain error may include inaccurate estimation of shunt resistance, operational amplifier gain, or some combination thereof. Oftentimes, the current measurement gain error may go undetected. Further, there may be one or more faulted current sensors responsible for causing the current measurement gain error in a current measurement system. A machine may experience undesirable effects depending on the cause of the current measurement gain error, the severity of the current measurement gain error, and/or the continued use of the one or more faulted current sensors.

SUMMARY

This disclosure relates generally to detection of current measurement gain errors.

An aspect of the disclosed embodiments includes a system for detecting a current measurement gain error in a current measurement system. The system includes a processor and a memory. The memory includes instructions that, when executed by the processor, cause the processor to: read an output voltage signal, extract a signature of a current measurement gain error from the output voltage signal, detect an existence of the current measurement gain error based on the signature; and responsive to detecting the existence of the current measurement gain error, identify a phase in which the current measurement gain error exists.

Another aspect of the disclosed embodiments includes a method for detecting a current measurement gain error in a current measurement system. The method includes reading an output voltage signal, extracting a signature of a current measurement gain error from the output voltage signal, detecting an existence of the current measurement gain error based on the signature, and responsive to detecting the existence of the current measurement gain error, identifying a phase in which the current measurement gain error exists.

Another aspect of the disclosed embodiments includes an electronic device. The electronic device includes a processor and a memory. The memory includes instructions that, when executed by the processor, cause the processor to: read an output voltage signal, extract a signature of a current measurement gain error from the output voltage signal, detect an existence of the current measurement gain error based on the signature; and responsive to detecting the existence of the current measurement gain error, identify a phase in which the current measurement gain error exists.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
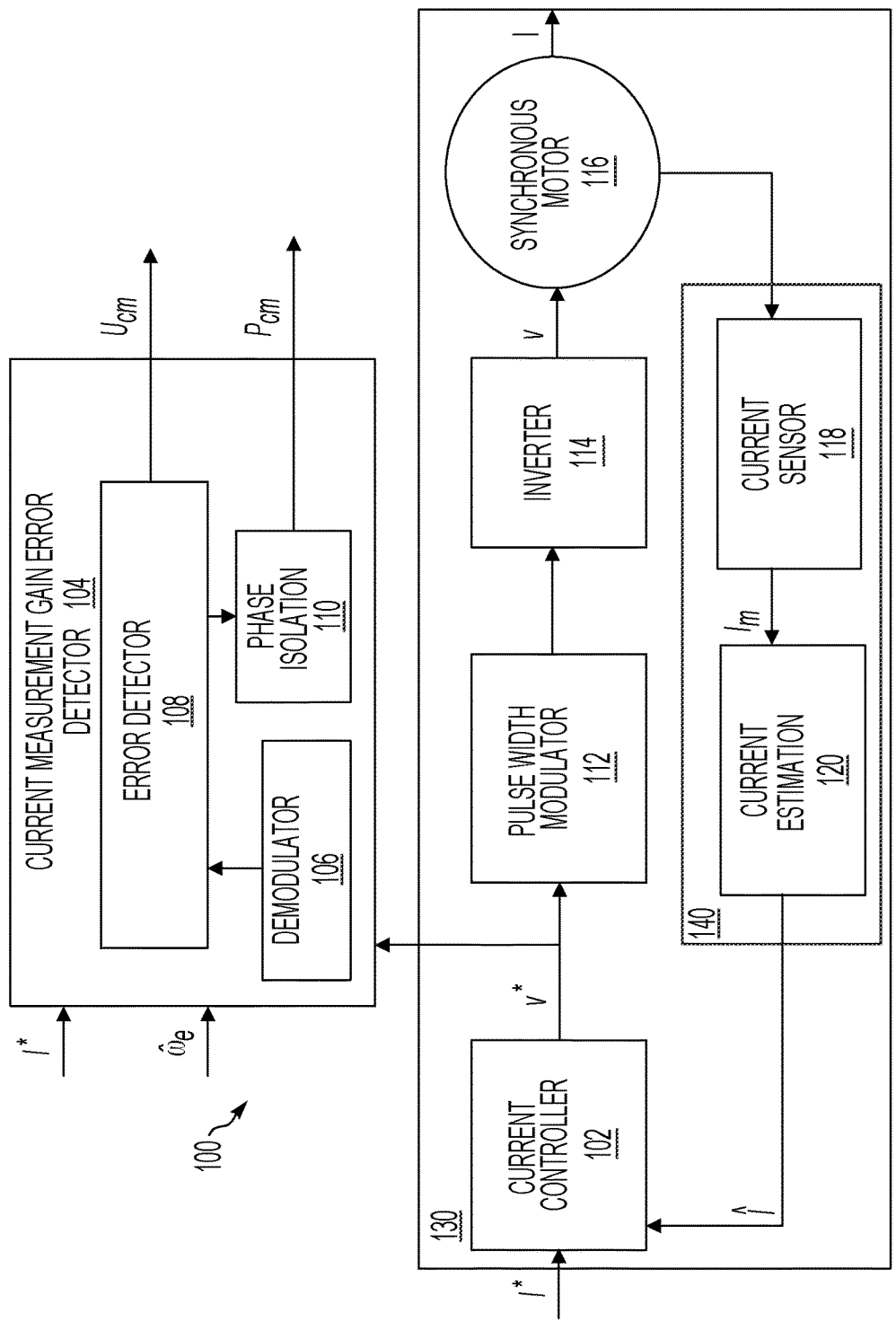
FIG. 1 generally illustrates a current measurement gain error detection and phase identification system according to the principles of the present disclosure.

The following discussion is directed to various embodiments of the disclosed subject matter. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Some motion control application (e.g., vehicles, boats, airplanes, drones, power equipment, yard equipment, pumps, compressors, etc.) may include a synchronous motor drive that controls a synchronous motor operated with closed loop control. A current measurement system may be included in the closed loop to measure the current output by the synchronous motor. The current measurement systems may be susceptible to current measurement gain errors.

A current measurement gain error may refer to a difference between a measured current and a true current or an actual current. The measured current may be measured by the current measurement system and the commanded or referenced current may be input by an operator of the machine or preconfigured for the machine. Example causes of a current measurement gain error may include inaccurate estimation of shunt resistance, operational amplifier gain, excessive temperatures, or some combination thereof.

Often times, the current measurement gain error may go undetected. Further, there may be one or more faulted current sensors responsible for causing the current measurement gain error in the machine. A motor may experience undesirable effects depending on the cause of the current measurement gain error, the severity of the current measurement gain error, and/or the continued use of the one or more faulted current sensors. Such current measurement gain error(s), if left undetected and/or uncorrected, may result in overall system performance degradation and/or motor faults. Further, the overall system degradation may impact the longevity of the synchronous motors, and/or customer appeal to purchase equipment that includes the synchronous motor. As a result, it is desirable to detect, identify, and mitigate the current measurement gain error.

Accordingly, the systems and methods, such as those described herein, may be configured to address the issues above by providing techniques for detecting and identifying current measurement gain errors, as well as performing preventative actions based on the current measurement gain errors. In some embodiments, the systems and methods described herein may enable detecting, learning, and compensating for current measurement gain error induced effects on the motor drive.

In some embodiments, the systems and methods described herein may be configured to provide techniques for real-time detection of current measurement gain error in current measurement systems utilized in feedback controlled synchronous motor drives. Further, the systems and methods described herein may enable identifying the particular phase at which the current measurement gain error is experienced. The systems and methods described herein may enable identifying the specific current sensor that faulted and caused the current measurement gain error at that phase.

The systems and methods described herein may be configured to use various mathematical models to extract a signature of a current measurement gain error, detect an existence of the current measurement gain error based on the signature, and identify a phase of the synchronous motor in which the current measurement gain error exists.

In some embodiments, the systems and methods described herein may be configured to perform a preventative action based on the detected current measurement gain error, the phase that is identified to have the current measurement gain error, and/or the current sensor identified as causing the current measurement gain error. The preventative action may include causing the synchronous motor drive to remain in a same mode of operation in which the synchronous motor is operating or to change to a different mode of operation than the one in which the synchronous motor drive is currently operating. The systems and methods described herein may be configured to use different modes of operation such as a current mode and a voltage mode.

The disclosed embodiments provide at least the following benefits including a diagnostic technique for the detection of (static) gain errors in the motor current measurement system utilized for synchronous motor drives. The diagnostic is applicable for phase current measurement system under any condition and for both low side and in-line type current measurement systems. The disclosed modeling of current measurement sensor gain errors and extraction of the signature of the current measurement sensor gain errors enables detection of the current measurement sensor gain errors, and identification of the phase in which the current measurement sensor gain errors exists to identify of the faulted current sensor. The disclosed techniques are applicable to any electric motor drives with alternative current (AC) electric machines and any current measurement architectures (both in-line and low side). A low side current measurement system may refer to placing a current sensor between the lower switch of a phase leg of the power converter and the ground. An in-line current measurement system may refer to placing a current sensor in series with the motor phase winding so that current flowing through the motor phase also flows through the current sensor. Further, the disclosed embodiments may be implemented by a processor for real-time detection, identification, and/or correction while the synchronous motor is being operated. The disclosed embodiments may also be implemented by a processor at the end of line (EOL) at manufacturing plants.

FIG. 1 generally illustrates a current measurement gain error detection and phase identification system 100 (referred to as "system" herein) according to the principles of the present disclosure. The system 100 may include a current controller 102, a current measurement gain error detector 104, a pulse width modulator 112, an inverter 114, a synchronous motor 116, a current sensor 118, and a current estimation component 120. It should be noted that fewer or more components may be included in the system 100 as desired to perform the techniques disclosed herein and the components depicted are for explanatory purposes. The synchronous motor 116 may generate rotational or linear force used to power a motion control system, such as those described herein. Various components of the system 100 may be used as part of a synchronous motor drive 130 (e.g., the current controller 102, the current measurement gain error detector 104, the pulse width modulator 112, the inverter 114, or some combination thereof). The synchronous motor drive 130 may be an electronic device that harnesses and controls the electrical energy sent to the synchronous motor 116. The synchronous motor drive 130 may involve applying voltages to the synchronous motor 116 in varying amounts and at varying frequencies, thereby indirectly controlling the speed and/or torque of the synchronous motor 116.

A current measurement system 140 may include the current estimation component 120 and the current sensor 118. Any suitable type of current sensor 118 that is capable of detecting an electric current in a circuit may be used. The current sensor 118 may provide signals indicating to the current to the current estimation component 120. The current estimation component 120 may be capable of receiving the signals indicating to the current and estimating the amount of current output by the synchronous motor 116.

The current controller 102 may receive a commanded current (I*) that is input by a user using a computing device or is preprogrammed by default for the synchronous motor 116. In some embodiments, the current controller 102 is used in a feedback controlled synchronous motor drive to track the commanded currents with minimal error. The current controller 102 transmits an output voltage signal to the pulse width modulator 112. The pulse width modulator 112 may control the proportion of time the output voltage signal is high compared to when it is low over a consistent period of time. Controlling the proportion of time the output voltage signal is high or low may control the direction of the synchronous motor 116. The inverter 114 may be a voltage source inverter and may vary the frequency of the supply fed to the synchronous motor 116 to control the speed of the synchronous motor 116. The synchronous motor 116 may receive an output voltage signal (V) as an input. The synchronous motor 116 may use the input to output an amount of current I that may be equal to the commanded current or vary from the commanded current.

The current I output from the synchronous motor 116 may be sensed by the current sensor 118. The current estimation component 120 outputs the estimated current (I) to the current controller 102. Accordingly, as depicted a closed loop for current control is used by the system 100.

The current controller 102 may receive the estimated current and compare it to the commanded current. If there is any variation, the current controller 102 may transmit an output voltage signal (V*) that will cause the measured current $\hat{I}$ to match the commanded current I*. As such, if the commanded current I* is assumed to be constant and the estimated current $\hat{I}$ equals the commanded current I*, then the estimated current $\hat{I}$ is also constant. To maintain the constant measured current, the current controller 102 may pulsate the output voltage signal, particularly when a current measurement error exists.

The current measurement gain error detector 104 reads the output voltage signal from the current controller 102. The current measurement gain error controller 104 may include a demodulator 106, an error detector 108, and a phase isolation 110. The demodulator 106 may consist of a mathematical transformation or operation which is dependent on the position of the synchronous motor. In some embodiments, the system 100 may be include one or more bypass filters. The bypass filters may be configured to perform pre-filtering in the synchronous frame before transformation or use adaptive low-pass filters in the pseudo-stationary framed tuned (adaptively) in accordance with the pulsation frequency of two times the synchronous frequency.

As will be described, the error detector 108 may use mathematical models to extract a signature of a current measurement gain error (e.g., in the event that a gain error is present). The error detector 108 receives the output voltage signal. The error detector 108 determines whether a current measurement gain error exists based on the output voltage signal. For example, if the error detector 108 determines that the output voltage signal just includes a constant part, without a sinusoidal part, then the error detector 108 determines there is no current measurement gain error represented in the output voltage signal. The sinusoidal part may refer to pulsating portion of the output voltage signal and may represent at least the signature of the current measurement gain error. If the error detector 108 determines the output voltage signal includes the constant part and the sinusoidal part, then the current measurement gain error detector 108 determines a parameter imbalance is detected because the sinusoidal part represents the signature of the current measurement gain error.

The error detector 108 may use a mathematical transformation 106 to determine an existence of the current measurement gain error based on the signature being present. For example, the error detector 108 may determine a magnitude of the transformed voltage signal from 106 and compare the magnitude of the output voltage signal to a threshold. If the magnitude satisfies the threshold, then the error detector 108 determines that a current measurement gain error exists. Further, as will be described, the phase isolation 110 determines at least one phase of the synchronous motor in which the current measurement gain error exists. In some embodiments, the phase isolation 110 may determine more than one phase include the current measurement gain error. Further, the phase isolation 110 may use the information to identify the specific current sensor 118 that contains the current measurement gain error.

The phase isolation 110 may identify other information using the mathematical models, where the other information pertains to why the specific current sensor 118 caused the current measurement gain error. The information may relate to the current sensor producing an inaccurate estimation of shunt resistance, operational amplifier gain, or some combination thereof. The error detector 108 may output the magnitude of the current measurement gain error. The phase isolation 110 may output the phase(s) in which the current measurement gain error exists and/or the specific faulted current sensor 118. A controller or circuitry included in the system 100 may perform a preventative action, such as causing the mode of operation of the synchronous motor drive 130 to be changed or to remain the same, causing a notification regarding the faulted current sensor 118 to be presented on a display of a computing device, or the like.

The following discussion pertains to the mathematical models used the systems and methods described herein. The systems and methods may utilize a model of a current measurement system after a reference frame transformation is applied from a stationary (abc) to a synchronous (dq0) frame is performed. The measured motor phase current with gain errors may be expressed as follows:

$$I_{am} = (1 + \Delta K_{ga})I_a$$

$$I_{bm} = (1 + \Delta K_{gb})I_b$$

$$I_{cm} = (1 + \Delta K_{gc})I_c \quad \text{Equation 1.}$$

where $I_x$ and $I_{xm}$ represent the actual and measured currents for phase x while $\Delta K_{gx}$ represents the gain error in measurement. The reference frame transformation may be applied to Equation 1 compute the dq0 current estimates, where the reference frame transformation (e.g., Clarke-Park transform) is expressed as follows:

$$h_{dq0} = Th_{abc} \quad \text{Equation 2}$$

$$T = \frac{2}{3} \begin{bmatrix} \cos\theta & \cos(\theta - \beta) & \cos(\theta - 2\beta) \\ \sin\theta & \sin(\theta - \beta) & \sin(\theta - 2\beta) \\ \frac{1}{2} & \frac{1}{2} & \frac{1}{2} \end{bmatrix}.$$

where h may represent the voltage, current, or flux linkage, $\beta$ is a constant equal to $$\frac{2\pi}{3}$$

for a 3-phase machine and $\theta$ is the electrical position. The inverse Clarke-Park transform is expressed as follows:

$$h_{abc} = T_i h_{dq0} \quad \text{Equation 3}$$

$$T_i = T^{-1} = \begin{bmatrix} \cos\theta & \sin\theta & 1 \\ \cos(\theta - \beta) & \sin(\theta - \beta) & 1 \\ \cos(\theta - 2\beta) & \sin(\theta - 2\beta) & 1 \end{bmatrix}.$$

The following application of the Clarke-Park transform in Equation 2 to the measured motor phase current with gain errors represented in Equation 1 to compute dq0 current estimates is expressed as follows:

$$\hat{I}_d = \frac{2}{3}(I_{am}\cos\theta + I_{bm}\cos(\theta - \beta) + I_{cm}\cos(\theta - 2\beta)) = I_d + \Delta I_{gd}. \quad \text{Equation 4}$$

$$\Delta I_{gd} = \frac{\Delta K_{gs}I_d + \Delta K_{gp}(\cos(2\theta + \phi_{gp})I_d + \sin(2\theta + \phi_{gp})I_q)}{}. \quad \text{Equation 5}$$

$$\hat{I}_q = \frac{2}{3}(I_{am}\sin\theta + I_{bm}\sin(\theta - \beta) + I_{cm}\sin(\theta - 2\beta)) = I_q + \Delta I_{gq}. \quad$$

$$\Delta I_{gq} = \frac{\Delta K_{gs}I_q + \Delta K_{gp}(\sin(2\theta + \phi_{gp})I_d - \cos(2\theta + \phi_{gp})I_q)}{}. \quad \text{Equation 6}$$

$$\Delta K_{gs} = \frac{\Delta K_{ga} + \Delta K_{gb} + \Delta K_{gc}}{3} \quad \text{Equation 7}$$

$$\Delta K_{gp} = \frac{1}{3}\sqrt{\begin{array}{l}\Delta K_{ga}^2 + \Delta K_{gb}^2 + \Delta K_{gc}^2 - \\ \Delta K_{ga}\Delta K_{gb} - \Delta K_{gb}\Delta K_{gc} - \\ \Delta K_{gc}\Delta K_{ga}\end{array}}$$

$$\phi_{gp} = \tan^{-1}\left(\frac{\sqrt{3}(-\Delta K_{gb} + \Delta K_{gc})}{2\Delta K_{ga} - \Delta K_{gb} - \Delta K_{gc}}\right).$$

Equations 4-7 may be expressed in matrix form as follows:

$$\begin{bmatrix}I_{dm}\\I_{qm}\end{bmatrix} = \underbrace{\begin{bmatrix}1+\Delta K_{gs} & 0 \\ 0 & 1+\Delta K_{gs}\end{bmatrix}\begin{bmatrix}I_d\\I_q\end{bmatrix}}_{\text{DC component}} + \quad \text{Equation 8}$$

$$\Delta K_{gp}\underbrace{\begin{bmatrix}\cos(2\theta+\phi_{gp}) & \sin(2\theta+\phi_{gp}) \\ \sin(2\theta+\phi_{gp}) & -\cos(2\theta+\phi_{gp})\end{bmatrix}\begin{bmatrix}I_d\\I_q\end{bmatrix}}_{\text{AC component with unique current measurement gain error signature}}$$

The mathematical model expressed in Equation 8 represents a sensing subsystem and represents what the measured currents are when closed-loop current control for a synchronous motor is not active. In some embodiments, when high bandwidth current controllers 102 are employed in a feedback current controlled synchronous motor drive, the measured current may be approximately or exactly equal to the commanded or reference current, which may be expressed as follows:

$$I_{dm} = \frac{\omega_d}{s+\omega_d}I_d^* \approx I_d^* \quad \text{Equation 9}$$

$$I_{qm} = \frac{\omega_q}{s+\omega_q}I_q^* \approx I_q^*.$$

where $\omega_d$ and $\omega_q$ are the closed-loop bandwidth parameter setting of the current controller. When the bandwidth is sufficiently high, the actual currents may be approximated as follows:

$$\begin{bmatrix}I_d\\I_q\end{bmatrix} = \frac{1}{(1+\Delta K_{gs})^2 - \Delta K_{gp}^2} \quad \text{Equation 10}$$

$$\begin{bmatrix}1+\Delta K_{gs} - \Delta K_{gp}\cos(2\theta+\phi_{gp}) & -\Delta K_{gp}\sin(2\theta+\phi_{gp}) \\ -\Delta K_{gp}\sin(2\theta+\phi_{gp}) & 1+\Delta K_{gs} + \Delta K_{gp}\cos(2\theta+\phi_{gp})\end{bmatrix}\begin{bmatrix}I_d^*\\I_q^*\end{bmatrix} =$$

$$\frac{1}{(1+\Delta K_{gs})^2 - \Delta K_{gp}^2}\begin{bmatrix}1+\Delta K_{gs} & 0 \\ 0 & 1+\Delta K_{gs}\end{bmatrix}\begin{bmatrix}I_d^*\\I_q^*\end{bmatrix} +$$

$$\frac{\Delta K_{gp}}{(1+\Delta K_{gs})^2 - \Delta K_{gp}^2}\begin{bmatrix}-\cos(2\theta+\phi_{gp}) & -\sin(2\theta+\phi_{gp}) \\ -\sin(2\theta+\phi_{gp}) & \cos(2\theta+\phi_{gp})\end{bmatrix}\begin{bmatrix}I_d^*\\I_q^*\end{bmatrix}.$$

where $I_d^*$ and $I_q^*$ are the current commands.

In some embodiments, commanded or actual motor voltages may then be computed as follows:

$$\begin{bmatrix}V_d\\V_q\end{bmatrix} = \begin{bmatrix}L_d s+R & \omega_e L_q \\ -\omega_e L_d & L_q s+R\end{bmatrix}\begin{bmatrix}I_d\\I_q\end{bmatrix} + \begin{bmatrix}0\\\omega_e\lambda_m\end{bmatrix} = \begin{bmatrix}L_d s+R & \omega_e L_q \\ -\omega_e L_d & L_q s+R\end{bmatrix} \quad \text{Equation 11}$$

$$\left(\Delta\begin{bmatrix}1+\Delta K_{gs} - \Delta K_{gp}\cos(2\theta+\phi_{gp}) & -\Delta K_{gp}\sin(2\theta+\phi_{gp}) \\ -\Delta K_{gp}\sin(2\theta+\phi_{gp}) & 1+\Delta K_{gs} + \Delta K_{gp}\cos(2\theta+\phi_{gp})\end{bmatrix}\right)\begin{bmatrix}I_d^*\\I_q^*\end{bmatrix} + \begin{bmatrix}0\\\omega_e\lambda_m\end{bmatrix} =$$

$$\frac{1+\Delta K_{gs}}{(1+\Delta K_{gs})^2 - \Delta K_{gp}^2}\begin{bmatrix}L_d s+R & \omega_e L_q \\ -\omega_e L_d & L_q s+R\end{bmatrix}\begin{bmatrix}I_d^*\\I_q^*\end{bmatrix} + \begin{bmatrix}0\\\omega_e\lambda_m\end{bmatrix} + \frac{\Delta K_{gp}}{(1+\Delta K_{gs})^2 - \Delta K_{gp}^2}$$

$$\begin{bmatrix}-R\cos(2\theta+\phi_{gp}) - \omega_e(L_q - 2L_d)\sin(2\theta+\phi_{gp}) & -R\sin(2\theta+\phi_{gp}) + \omega_e(L_q - 2L_d)\cos(2\theta+\phi_{gp}) \\ -R\sin(2\theta+\phi_{gp}) - \omega_e(2L_q - L_d)\cos(2\theta+\phi_{gp}) & R\cos(2\theta+\phi_{gp}) - \omega_e(2L_q - L_d)\sin(2\theta+\phi_{gp})\end{bmatrix}$$

$$\begin{bmatrix}I_d^*\\I_q^*\end{bmatrix}.$$

By demodulating the dq voltage waveforms, the pulsating components (sinusoidal part) $\Delta V_{dq}$ that are unique to current measurement gain errors may be extracted. In some embodiments, the a mathematical transformation may be applied to the voltage signals with an appropriate frequency of two per electrical revolution as follows:

$$\begin{bmatrix} V_u \\ V_v \end{bmatrix} = \begin{bmatrix} \cos 2\theta & \sin 2\theta \\ \sin 2\theta & -\cos 2\theta \end{bmatrix} \begin{bmatrix} \Delta V_d \\ \Delta V_q \end{bmatrix}. \qquad \text{Equation 12}$$

In some embodiments, for a non-salient pole machine, i.e., where $L_d = L_q = L$, the DC portion of the transformed voltage signals are expressed as follows:

$$\begin{bmatrix} V_u \\ V_v \end{bmatrix} = \frac{\Delta K_{gp}}{(1+\Delta K_{gs})^2 - \Delta K_{gp}^2} \qquad \text{Equation 13}$$

$$\begin{bmatrix} -R\cos\phi_{gp} + \omega_e L \sin\phi_{gp} & -R\sin\phi_{gp} + \omega_e L\cos\phi_{gp} \\ R\sin\phi_{gp} + \omega_e L\cos\phi_{gp} & -R\cos\phi_{gp} + \omega_e L\sin\phi_{gp} \end{bmatrix} \begin{bmatrix} I_d^* \\ I_q^* \end{bmatrix}.$$

The transformed voltage signals may be further manipulated to determine a diagnostic voltage magnitude and diagnostic voltage phase as follows:

$$\begin{bmatrix} V_m \\ \phi \end{bmatrix} = \begin{bmatrix} \sqrt{V_u^2 + V_v^2} \\ \tan^{-1}\left(\frac{V_v}{V_u}\right) \end{bmatrix} = \qquad \text{Equation 14}$$

$$\begin{bmatrix} \dfrac{\Delta K_{gp}}{(1+\Delta K_{gs})^2 - \Delta K_{gp}^2} I_m^* \sqrt{R^2 + \omega_e^2 L^2} \\ \phi_{gp} + \tan^{-1}\left(\dfrac{\omega_e L}{R}\right) + \alpha^* \end{bmatrix}.$$

where $I_d^* = I_m^* \sin \alpha^*$ and $I_q^* = I_m^* \cos \alpha^*$.

Using the mathematical models including the Equations described herein, the current measurement gain errors may be detected by comparing the DC signals to appropriate pre-defined thresholds.

Figure 2:
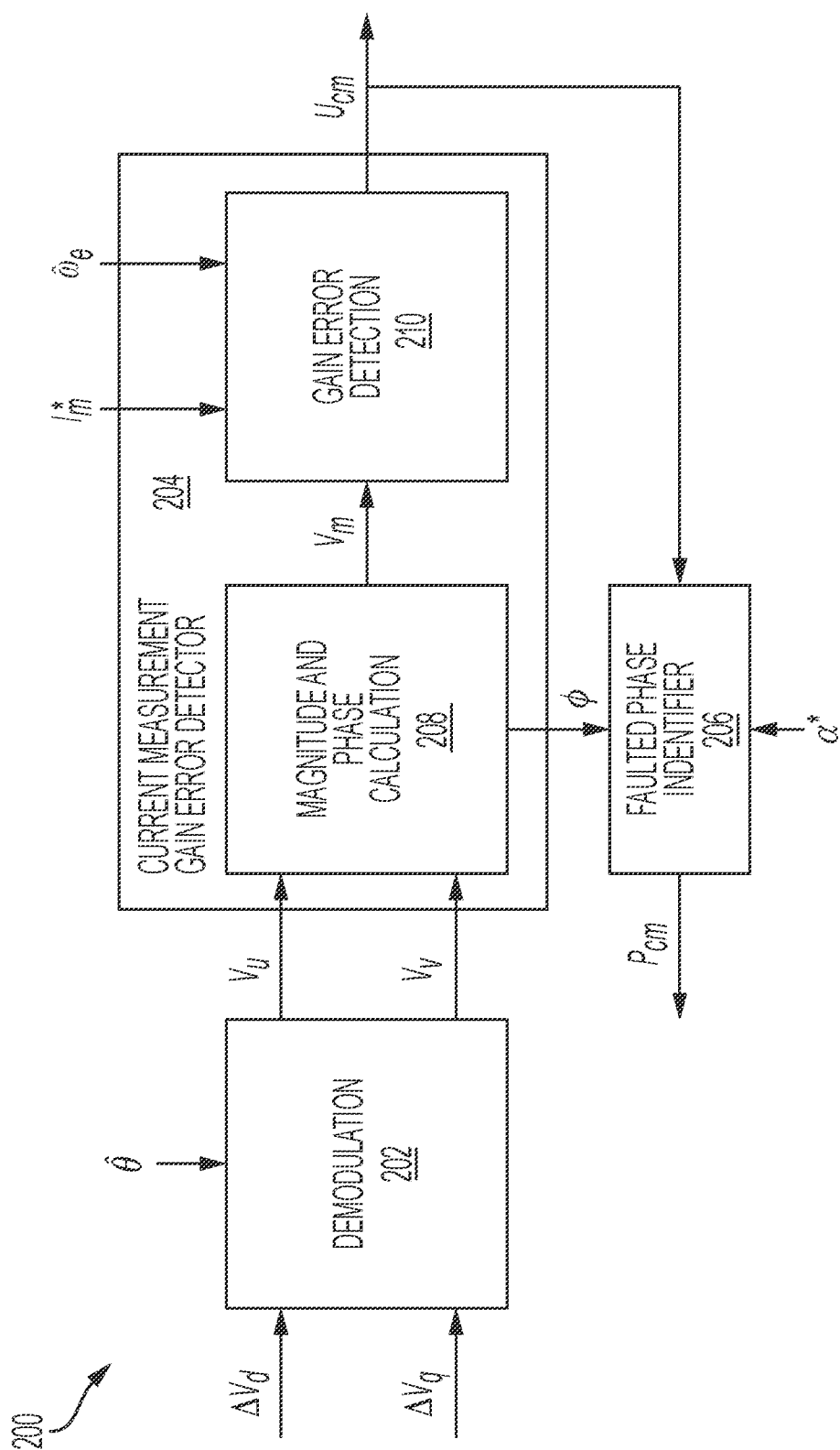
FIG. 2 generally illustrate a block diagram for detecting and identifying a current measurement gain error according to the principles of the present disclosure.

FIG. 2 generally illustrates a block diagram 200 for detecting and identifying a current measurement gain error according to the principles of the present disclosure. The block diagram 200 includes a block 202 for demodulation, a block for current measurement gain error detector 204, and a faulted phase identifier 206. The current measurement gain error detector 204 includes a magnitude and phase calculation block 208 and gain error detector block 210. The blocks 202, 204 and 206 may be performed by the demodulator 106, the error detector 108 and phase isolation 110 respectively.

The demodulation block 202 may receive final synchronous frame voltages (e.g., output voltage signal) from the current controller 102. The demodulation block 202 may apply the Equation 12 to the final synchronous frame voltages after performing filtering to extract diagnostic voltages $V_u$ and $V_v$. The magnitude and phase calculation block 208 may calculate a diagnostic voltage magnitude $V_m$, as described in Equation 14, that contains information of the presence of a current measurement gain error. The gain error detector block 210 may compare the diagnostic voltage magnitude to a predetermined threshold to check if the threshold has been exceeded. The comparison may be further performed using estimates of the motor velocity $\hat{\omega}_e$, resistance $\hat{R}$ and inductance $\hat{L}$ and the current command magnitude $I_m^*$ using Equation 14. For instance, the diagnostic voltage magnitude may be compared to a threshold when the current command is higher than a predetermined current threshold. If the diagnostic voltage magnitude satisfies the threshold, the gain error detector block 210 may output a current measurement gain error indicator $U_{cm}$ that indicates the presence of a current measurement gain error in one or more of the motor phases.

The faulted phase identifier block 206 may receive the diagnostic voltage phase signal from the magnitude and phase calculation block 208 and utilize it to identify the specific motor phase $P_{cm}$ (e.g., A, B, or C in a 3-phase synchronous motor) in which the current measurement gain error exists. The faulted phase identifier block 206 may identify a specific current sensor 118 that contains the current measurement gain error based on the diagnostic voltage phase. When a current measurement gain error is detected by the gain error detector 210, the faulted phase identifier block 206 utilizes the diagnostic voltage phase $\phi$ along with the current angle command $\alpha^*$ and estimates of resistance $\hat{R}$ and inductance $\hat{L}$, as described in Equation 14, to determine whether a single motor phase (out of phase A, B, C) contains the gain error or whether multiple phases have gain errors simultaneously by setting the gain error phase identifier signal $P_{cm}$ to A, B, C or M, where M indicates simultaneous gain errors in multiple phases. In the case when a single phase is unbalanced, the faulted phase identifier block 206 identifies the specific phase. The gain error phase identification logic is as follows:

$$P_{cm} = \begin{cases} A, & -\phi_w \leq \phi' \leq \phi_w \\ B, & \phi_0 - \phi_w \leq \phi' \leq \phi_0 + \phi_w \\ C, & -\phi_0 - \phi_w \leq \phi' \leq -\phi_0 + \phi_w \\ M, & \text{OTHERWISE} \end{cases}$$

where $$\phi' = \phi - \alpha^* - \tan^{-1}\left(\frac{\hat{\omega}_e \hat{L}}{R}\right)$$

represents an estimate of $\phi_{gp}$, $\phi_0 = \tan^{-1} \sqrt{3}$ and $\phi_w$ is a phase angle tolerance window for the gain error phase identification. Note that the diagnostic voltage phase becomes equal to 0, $\phi_0$, $-\phi_0$ when the imbalance is in phase A, B, C respectively. This may be determined by setting the value of the gain error in any single phase to a non-zero value and setting the other deviations to zero. For instance, if $\Delta K_{gb}$ is non-zero while $\Delta K_{ga}$ and $\Delta K_{gc}$ are zero in Equation 5 due to a gain error in phase B, the resulting phase angle $\phi_{gp}$ becomes $\phi_0$. Similar calculations may be performed for the other phases using Equation 5.

Figure 3:
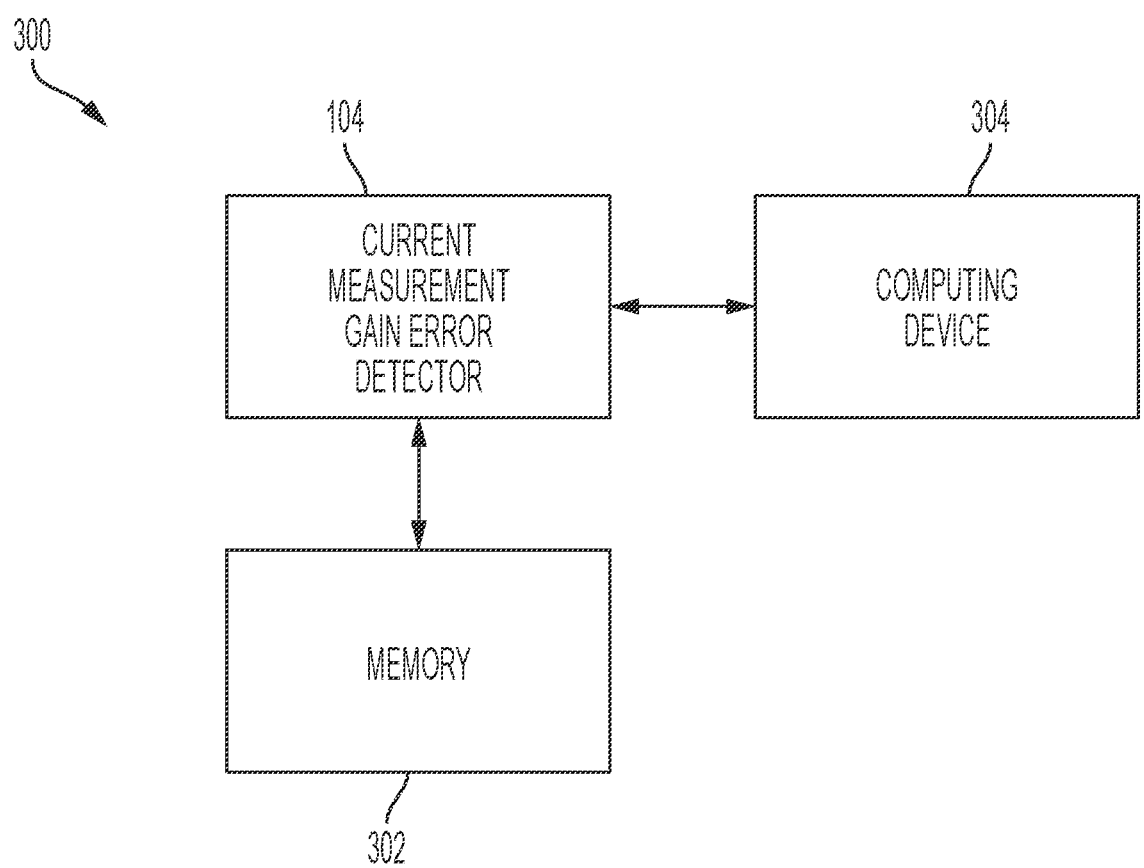
FIG. 3 generally illustrates a system according to the principles of the present disclosure.

FIG. 3 generally illustrates a controller system 300 according to the principles of the present disclosure. The controller system 300 includes the current measurement gain error controller 104 communicatively coupled to a memory 302. The current measurement gain error detector 104 may include a processor. The processor may include any suitable processor, such as those described herein. The memory 302 may store instructions that, when executed by the current measurement gain error detector 104, cause the current measurement gain error detector 104 to, at least, perform the techniques disclosed herein. In particular, the computer instructions, when executed by the current measurement gain error detector 104, may cause the current measurement gain error detector 104 to perform the operations of the method 400 as further described below with reference to FIG. 4. The controller system 300 may be communicatively coupled to a computing device 304. The computing device 304 may include a processor, a memory, a network interface, and/or a display. In some embodiments, the display of the computing device 304 may present notifications received from the current measurement gain error detector 104.

Figure 4:
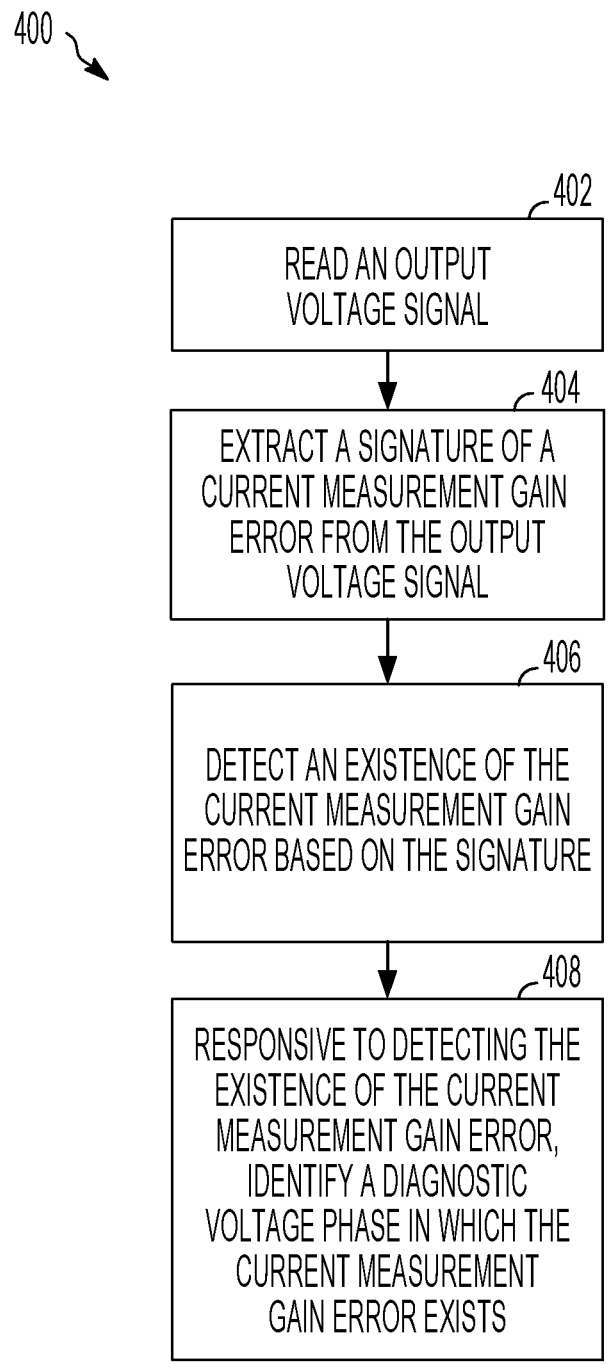
FIG. 4 is a flow diagram generally illustrating a method for current measurement gain error detection and phase identification according to the principles of the present disclosure.

FIG. 4 is a flow diagram generally illustrating a method 400 for current measurement gain error and phase identification according to the principles of the present disclosure. At 402, the method 400 reads an output voltage signal. For example, the current controller 102 may generate the output voltage signal. At 404, the method 400 extracts a signature of a current measurement gain error from the output voltage signal. In some embodiments, the output voltage signal may include just a constant part, and in some embodiments, the output voltage signal may include a constant part and a sinusoidal part. If the output voltage signal just includes the constant part, then there may be no current measurement gain error because the sinusoidal part of the output voltage signal represents the pulsations that include the signature of the current measurement gain error. Accordingly, when the output voltage signal includes the constant part and the sinusoidal part, the sinusoidal part is extracted as the signature of the current measurement gain error. The sinusoidal part may correspond to a pulsating portion of the output voltage signal and may result from the current controller 102 keeping the measured and/or estimated current containing a current measurement gain error equal to the commanded current.

At 406, the method 400 detects an existence of the current measurement gain error from the output voltage signal. That is, if the signature of the current measurement gain error is extracted. Then, the method 400 determines a diagnostic voltage magnitude and compares the magnitude to a threshold. In some embodiments, the method 400 may use the Equation 14 when comparing to the threshold. If the diagnostic voltage magnitude satisfies the threshold, then the method 400 detects the existence of the current measurement gain error. If the diagnostic voltage magnitude does not satisfy the threshold, then the method 400 does not detect the existence of the current measurement gain error.

At 408, responsive to detecting the existence of the current measurement gain error, the method 400 identifies a diagnostic voltage phase in which the current measurement gain error exists. The method 400 may use the Equation 14 to determine the diagnostic voltage phase and then use it to identify a specific current sensor that has failed. Thus, the method 400 may identify a current sensor 118 that contains the current measurement gain error based on the diagnostic voltage phase. For example, different respective current sensors 118 may measure different respective phases. The method 400 may determine a mode of operation in which a synchronous motor drive is to operate based on information pertaining to the current sensor 118 that caused the current measurement gain error. Using one or more of the equations above, the method 400 may provide the information as to a current sensor fault occurred for low side and in-line current measurement systems.

The information may indicate there has been an inaccurate shunt resistance estimate, an operational amplifier gain, an excessive heat temperature, or some combination thereof. The method 400 may select to continue operating in a same mode of operation (e.g., voltage mode or current mode) in which the motor drive is currently operating since some current measurement gain errors are not as detrimental to the machine in certain operating condition. However, in some embodiments, the method 400 may select to change the mode of operation to a different mode (e.g., voltage mode or current mode) of operation than a mode of operation in which the motor drive is currently operating. In some embodiments, the method 400 may cause a notification to be presented on a computing device used by a user indicating that the identified current sensor 118 faulted and instructing an operator to examine, repair, and/or replace the faulted current sensor 118.

In some embodiments, a system for detecting a current measurement gain error in a motor drive includes a processor, and a memory that includes instructions. The instructions, when executed, cause the processor to read an output voltage signal, extract a signature of a current measurement gain error from the output voltage signal, detect an existence of the current measurement gain error based on the signature, and responsive to detecting the existence of the current measurement gain error, identify a phase in which the current measurement gain error exists.

In some embodiments, responsive to identifying the phase in which the current measurement gain error exists, the instructions further cause the processor to identify a current sensor that caused the current measurement gain error based on the phase. In some embodiments, the instructions further cause the processor to determine a mode of operation in which a synchronous motor drive is to operate based on information pertaining to why the current sensor caused the current measurement gain error, and cause the synchronous motor drive to operate in the mode of operation. In some embodiments, the information includes an inaccurate estimation of shunt resistance, operational amplifier gain, or some combination thereof. In some embodiments, the mode of operation is a same mode of operation in which the motor drive is currently operating. In some embodiments, the mode of operation is a different mode of operation than a mode of operation in which the motor drive is currently operating. In some embodiments, to detect the existence of the current measurement gain error based on the signature, the instructions further cause the processor to determine a magnitude of the output voltage signal satisfies a threshold.

In some embodiments, a method for detecting a current measurement gain error in a motor drive includes reading an output voltage signal, extracting a signature of a current measurement gain error from the output voltage signal, detecting an existence of the current measurement gain error based on the signature, and responsive to detecting the existence of the current measurement gain error, identifying a phase in which the current measurement gain error exists.

In some embodiments, responsive to identifying the phase in which the current measurement gain error exists, the method further includes identifying a current sensor that caused the current measurement gain error based on the phase. In some embodiments, the method further includes determining a mode of operation in which a synchronous motor drive is to operate based on information pertaining to why the current sensor caused the current measurement gain error, causing the synchronous motor drive to operate in the mode of operation. In some embodiments, the information includes an inaccurate estimation of shunt resistance, operational amplifier gain, or some combination thereof. In some embodiments, the mode of operation is a same mode of operation in which the motor drive is currently operating. In some embodiments, the mode of operation is a different mode of operation than a mode of operation in which the motor drive is currently operating.

In some embodiments, an electronic device includes a processor and a memory. The memory includes instructions that, when executed by the processor, cause the processor to read an output voltage signal, extract a signature of a current measurement gain error from the output voltage signal, detect an existence of the current measurement gain error based on the signature, and responsive to detecting the existence of the current measurement gain error, identify a phase in which the current measurement gain error exists.

In some embodiments, responsive to identifying the phase in which the current measurement gain error exists, the instructions further cause the processor to identify a current sensor that caused the current measurement gain error based on the phase. In some embodiments, the instructions further cause the processor to determine a mode of operation in which a synchronous motor drive is to operate based on information pertaining to why the current sensor caused the current measurement gain error, and cause the synchronous motor drive to operate in the mode of operation. In some embodiments, the information includes an inaccurate estimation of shunt resistance, operational amplifier gain, or some combination thereof. In some embodiments, the mode of operation is a same mode of operation in which the motor drive is currently operating. In some embodiments, the mode of operation is a different mode of operation than a mode of operation in which the motor drive is currently operating.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A system for detecting a current measurement gain error in a current measurement system, the system comprising:
   a processor; and
   a memory that includes instructions that, when executed by the processor, cause the processor to:
   read an output voltage signal;
   utilize a mathematical model of a closed loop current control system wherein the mathematical model comprises a current measurement gain error which includes at least a signature of pulsating voltage signals at a frequency of two per electrical revolution;
   perform, using the mathematical model, a mathematical transformation to demodulate the output voltage signal to extract the signature;
   detect an existence of the current measurement gain error based on the signature; and
   responsive to detecting the existence of the current measurement gain error, identify a motor phase in which the current measurement gain error exists.

2. The system of claim 1, wherein, responsive to identifying the motor phase in which the current measurement gain error exists, the instructions further cause the processor to identify a current sensor that caused the current measurement gain error based on the motor phase.

3. The system of claim 2, wherein the instructions further cause the processor to:
  determine a mode of operation in which a synchronous motor drive is to operate based on information pertaining to the current sensor that caused the current measurement gain error; and
  cause the synchronous motor drive to operate in the mode of operation.

4. The system of claim 3, wherein the information comprises an inaccurate estimation of shunt resistance, operational amplifier gain, or some combination thereof.

5. The system of claim 3, wherein the mode of operation is a current mode of operation.

6. The system of claim 3, wherein the mode of operation is a voltage mode of operation.

7. The system of claim 1, wherein to detect the existence of the current measurement gain error based on the signature, the instructions further cause the processor to determine a diagnostic voltage magnitude of the output voltage signal satisfies a threshold.

8. A method for detecting a current measurement gain error in a current measurement system, the method comprising:
  reading an output voltage signal;
  utilizing a mathematical model of a closed loop current control system wherein the mathematical model comprises a current measurement gain error which includes at least a signature of pulsating voltage signals at a frequency of two per electrical revolution;
  performing, using the mathematical model, a mathematical transformation to demodulate the output voltage signal to extract the signature;
  detecting an existence of the current measurement gain error based on the signature; and
  responsive to detecting the existence of the current measurement gain error, identifying a motor phase in which the current measurement gain error exists.

9. The method of claim 8, the method further comprising, responsive to identifying the motor phase in which the current measurement gain error exists, identifying a current sensor that caused the current measurement gain error based on the motor phase.

10. The method of claim 9, further comprising:
  determining a mode of operation in which a synchronous motor drive is to operate based on information pertaining to the current sensor that caused the current measurement gain error; and
  causing the synchronous motor drive to operate in the mode of operation.

11. The method of claim 10, wherein the information comprises an inaccurate estimation of shunt resistance, operational amplifier gain, or some combination thereof.

12. The method of claim 10, wherein the mode of operation is a current mode of operation.

13. The method of claim 10, wherein the mode of operation is a voltage mode of operation.

14. The method of claim 8, wherein detecting the existence of the current measurement gain error based on the signature further comprises determining a diagnostic voltage magnitude of the output voltage signal satisfies a threshold.

15. An electronic device comprising:
  a processor; and
  a memory that includes instructions that, when executed by the processor, cause the processor to:
    read an output voltage signal;
    utilize a mathematical model of a closed loop current control system wherein the mathematical model comprises a current measurement gain error which includes at least a signature of pulsating voltage signals at a frequency of two per electrical revolution;
    perform, using the mathematical model, a mathematical transformation to demodulate the output voltage signal to extract the signature;
    detect an existence of the current measurement gain error based on the signature; and
    responsive to detecting the existence of the current measurement gain error, identify a motor phase in which the current measurement gain error exists.

16. The electronic device of claim 15, wherein, responsive to identifying the motor phase in which the current measurement gain error exists, the instructions further cause the processor to identify a current sensor that caused the current measurement gain error based on the motor phase.

17. The electronic device of claim 16, wherein the instructions further cause the processor to:
  determine a mode of operation in which a synchronous motor drive is to operate based on information pertaining to the current sensor that caused the current measurement gain error; and
  cause the synchronous motor drive to operate in the mode of operation.

18. The electronic device of claim 17, wherein the information comprises an inaccurate estimation of shunt resistance, operational amplifier gain, or some combination thereof.

19. The electronic device of claim 17, wherein the mode of operation is a current mode of operation.

20. The electronic device of claim 17, wherein the mode of operation is a voltage mode of operation.

* * * * *